(12) United States Patent
Camacho et al.

(10) Patent No.: US 7,479,409 B2
(45) Date of Patent: Jan. 20, 2009

(54) INTEGRATED CIRCUIT PACKAGE WITH ELEVATED EDGE LEADFRAME

(75) Inventors: Zigmund Ramirez Camacho, Singapore (SG); Henry D. Bathan, Singapore (SG); Jose Alvin Caparas, Singapore (SG); Jeffrey D. Punzalan, Singapore (SG)

(73) Assignee: Stats Chippac LTD., Singapore (SG)

( * ) Notice: Subject to any disclaimer, the term of this patent is extended or adjusted under 35 U.S.C. 154(b) by 148 days.

(21) Appl. No.: 11/610,304

(22) Filed: Dec. 13, 2006

(65) Prior Publication Data

US 2008/0142934 A1 Jun. 19, 2008

(51) Int. Cl.
*H01L 21/00* (2006.01)
(52) U.S. Cl. .................. 438/123; 257/666; 257/667; 257/676; 257/E23.039
(58) Field of Classification Search .............. 257/666, 257/669, 667, 676, 735, 696, 692, E23.048, 257/E23.047, E23.043, E23.039, E23.031; 438/112, 110, 111, 123
See application file for complete search history.

(56) References Cited

U.S. PATENT DOCUMENTS

| 5,548,884 | A | 8/1996 | Kim |
| 6,399,415 | B1 | 6/2002 | Bayan et al. |
| 6,486,549 | B1 * | 11/2002 | Chiang ........................ 257/723 |
| 6,987,034 | B1 | 1/2006 | Chiang |
| 7,125,747 | B2 * | 10/2006 | Lee et al. ..................... 438/112 |

* cited by examiner

*Primary Examiner*—Minh-Loan T Tran
*Assistant Examiner*—Selim Ahmed
(74) *Attorney, Agent, or Firm*—Mikio Ishimaru

(57) ABSTRACT

An integrated circuit package system includes an elevated edge leadframe array, isolating leadframes of the elevated edge leadframe array, validating integrated circuit die attached to the leadframes, and forming integrated circuit packages including the integrated circuit die.

20 Claims, 3 Drawing Sheets

INTEGRATED CIRCUIT PACKAGE WITH ELEVATED EDGE LEADFRAME

TECHNICAL FIELD

The present invention relates generally to integrated circuit package systems, and more particularly to a system for integrated circuit packages with leadframes.

BACKGROUND ART

Electronic devices such as smart phones, personal digital assistants, location based devices, digital cameras, music players, computers, or transportation, have become an integral part of many daily activities. We take for granted the convenience and utility of these electronic devices and all too often do not appreciate just how much technology is involved in manufacturing integrated circuit packages for integrated circuit devices. Thus, many and various types of packaging, intended for protection, interconnection, or mounting, have been developed for integrated circuit devices.

Integrated circuit dies are conventionally enclosed in plastic packages that provide protection from hostile environments and enable electrical interconnection between the integrated circuit die and an underlying substrate such as a printed circuit board (PCB). The elements of such a package include a metal leadframe, an integrated circuit die, bonding material to attach the integrated circuit die to the leadframe, bond wires that electrically connect pads on the integrated circuit die to individual leads of the leadframe, and a hard plastic encapsulant material that covers the other components and forms the exterior of the package.

The leadframe is the central supporting structure of such a package. A portion of the leadframe is internal to the package (i.e., completely surrounded by the plastic encapsulant). Some or all of the leads of the leadframe can extend beyond the extent of the package or at least provide partial exposure beyond the encapsulant material. This allows the package to be used in electrically connecting the package to another component or next system level. In certain integrated circuit packages, a portion of the die pad of the leadframe also remains exposed within the exterior extents of the package for use as a heat sink.

For purposes of high-volume, low-cost production of integrated circuit packages, a current industry practice is to etch or stamp a thin sheet of metal material to form a panel or strip that defines multiple lead frames in an array of units. A single strip may be formed to include multiple arrays, with each such array including multiple leadframes in a pattern. In a typical integrated circuit package manufacturing process, the integrated circuit dies are mounted and wire bonded to individual leadframes, with the encapsulant material then being applied to the strip to encapsulate the integrated circuit dies, bond wires, and portions of each of the leadframes in the above-described manner. The units usually have all their leads electrically joined together by the leadframe connecting bar, such as rails and edges.

Upon the hardening of the encapsulant material, the leadframes within the strip are cut apart or singulated for purposes of producing the individual integrated circuit packages. Such singulation is typically accomplished via a saw singulation process. In this process, a saw blade is advanced along "saw streets" which extend in prescribed patterns between the leadframes as required to facilitate the separation of the leadframes from each other in the required manner. The advancement of the saw blade along the saw streets concurrently cuts the molded plastic mold cap, thus facilitating the formation of a molded plastic package body upon each of the separated leadframes and electrically isolating each unit from each other.

Electrical test is usually carried out on a single singulated unit, one piece at a time. Testing all units within the strip while it is still in strip form (rather than singularly) will definitely increase testing cycle time. This is however not possible without first doing an electrical isolation process, while still maintaining the strip form. Such an isolation process is usually carried out using partial singulation (or half-cutting) which cuts through the connecting bar. Such isolation process however, is quite messy because it makes the leadframe flimsy and breakable, mainly because it has cut through most of what used to stiffen the leadframe structure (that is the leadframe rails and edges).

As is well known in the field of integrated circuit packaging, a leadframe is used as a die carrier in a leadless package for smaller footprint and lower manufacturing cost. However, after singulation, a leadless integrated circuit package still needs to go through final test via individual test socket for the verification of the electrical performance; therefore, the cost of final test cannot be reduced. To date, leadframe panels or strips cannot withstand the stresses encountered in current testing. There continue to be concerns regarding testing of a matrix of a leadless leadframe before singulation. A new approach must be found in order to increase the efficiency of testing integrated circuit packages.

Thus, a need still remains for an integrated circuit package system to improve testing efficiency. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an elevated edge leadframe array, isolating leadframes of the elevated edge leadframe array, validating integrated circuit die attached to the leadframes, and forming integrated circuit packages including the integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
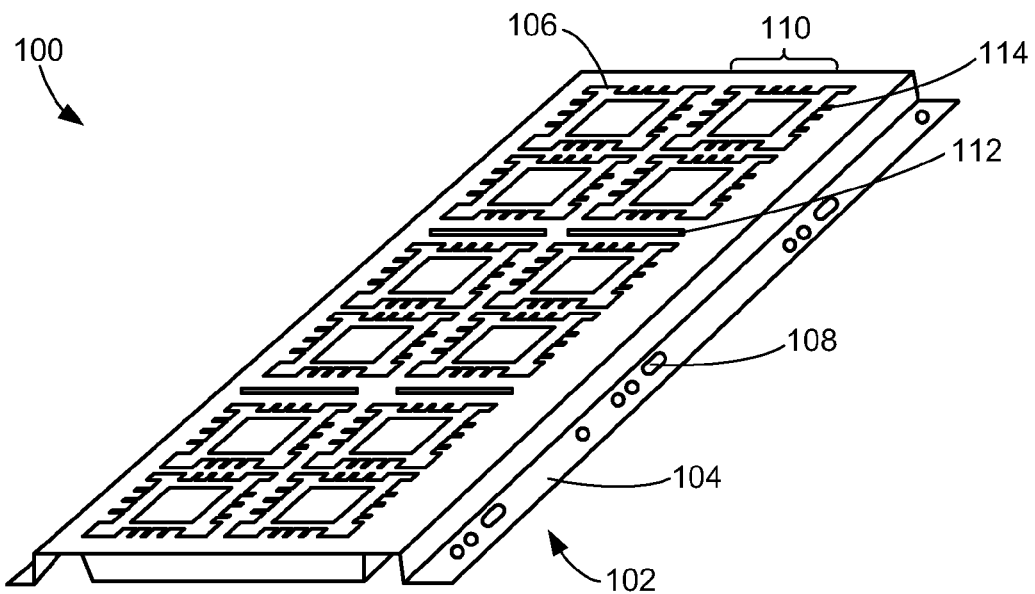
FIG. 1 is an isometric view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown an isometric view of an integrated circuit package system 100 in an embodiment of the present invention. The integrated circuit package system 100 includes an elevated edge leadframe array 102. The elevated edge leadframe array 102 includes a bent edge 104, such as a folded edge. The bent edge 104 of the elevated edge leadframe array 102 is elevated from a connection surface 106 of the elevated edge leadframe array 102. The bent edge 104 can also include edge recesses 108 that can improve handling or registration. The edge recesses 108 can be formed as partially recessed or as through holes.

The elevated edge leadframe array 102 also includes several leadframes 110. For illustrative purposes, a two by six array of the leadframes 110 are shown in the elevated edge leadframe array 102 although it is understood that the elevated edge leadframe array 102 may include any number of the leadframes 110. The elevated edge leadframe array 102 can also include separators 112. The separators 112 can be formed on the connection surface 106 such as a marking, a recess, or a cut. Each of the leadframes 110 in the elevated edge leadframe array 102 can include package connectors 114. The package connectors 114 provide connectivity to a next level system such as a printed circuit board.

It has been discovered that the integrated circuit package system 100 with the elevated edge leadframe array 102 improves structural integrity for further processing and improved compatibility with uncomplicated and lower cost isolation processes.

Figure 2:
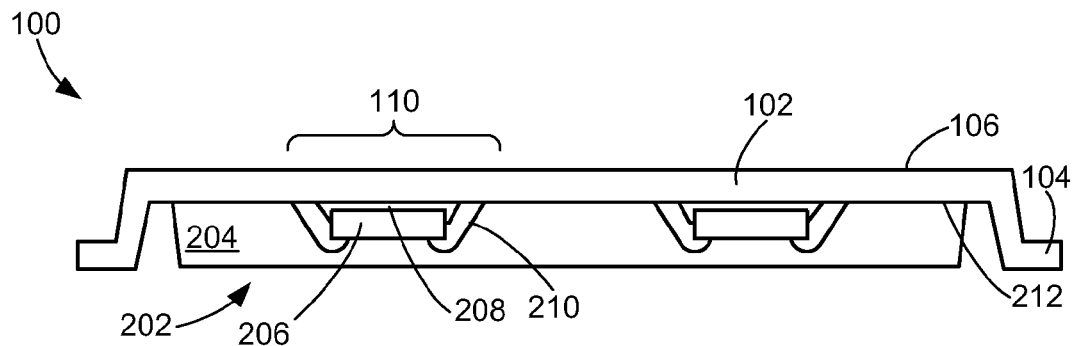
FIG. 2 is a cross-sectional view of the integrated circuit package system.

Referring now to FIG. 2, therein is shown a cross-sectional view of the integrated circuit package system 100. The integrated circuit package system 100 includes integrated circuit packages 202 formed by an encapsulant 204 over a side opposite the connection surface 106 of the elevated edge leadframe array 102. The integrated circuit packages 202 also include integrated circuit die 206 mounted with an attach layer 208, such as an adhesive, and electrically connected with die connectors 210, such as bond wires. The attach layer 208 provides a substantially fixed location for the integrated circuit die 206 on one of the leadframes 110. The die connectors 210 provide electrical connectivity between the integrated circuit die 206 and a mounting surface 212 of one of the leadframes 110.

The encapsulant 204 provides structural integrity and protection for the integrated circuit die 206, the die connectors 210 and a portion of the leadframes 110 during further processing such as sawing, cutting, singulating, or edge forming. One such process includes forming the bent edge 104 after molding the encapsulant 204. The bent edge 104 can be formed, such as folding towards the mounting surface 212 of the elevated edge leadframe array 102, around the extents of the encapsulant 204. The elevated edge leadframe array 102 can also be provided with the bent edge 104 preformed. For illustrative purposes, the integrated circuit package system 100 is shown having two of the leadframes 110 across a width of the elevated edge leadframe array 102 although it is understood that the width of the elevated edge leadframe array 102 may include any number of the leadframes 110.

It has been discovered that the integrated circuit packages 202 can provide electrical isolation from other of the integrated circuit packages 202 while providing physical integrity of the encapsulant 204 and the bent edge 104 of the elevated edge leadframe array 102.

Figure 3:
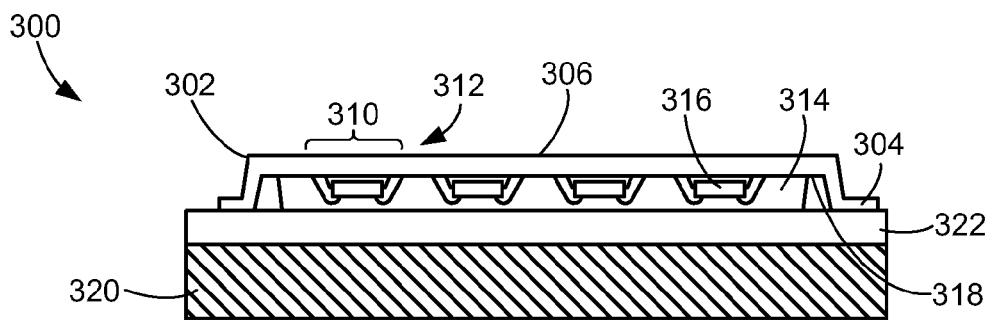
FIG. 3 is a cross-sectional view of an integrated circuit package system in an alternative embodiment of the present invention in a mounting phase.

Referring now to FIG. 3, therein is shown a cross-sectional view of an integrated circuit package system 300 in an alternative embodiment of the present invention in a mounting phase. In a manner similar to the integrated circuit package system 100 of FIG. 1, the integrated circuit package system 300 includes an elevated edge leadframe array 302. The elevated edge leadframe array 302 includes a bent edge 304, such as a folded edge. The bent edge 304 of the elevated edge leadframe array 302 is elevated from a connection surface 306 of the elevated edge leadframe array 302. The elevated edge leadframe array 302 also includes several leadframes 310. For illustrative purposes, the integrated circuit package system 300 is shown having four of the leadframes 310 across a width of the elevated edge leadframe array 302 although it is understood that the elevated edge leadframe array 302 may include any number of the leadframes 310.

In a manner similar to the integrated circuit package system 100 of FIG. 2, the integrated circuit package system 300 includes integrated circuit packages 312 formed by an encapsulant 314 over integrated circuit die 316 and over a mounting surface 318 of the elevated edge leadframe array 302 on a side opposite the connection surface 306. The integrated circuit package system 300 can be mounted over a fixture 320, such as a saw handler, with a mount layer 322, such as a saw tape.

Figure 4:
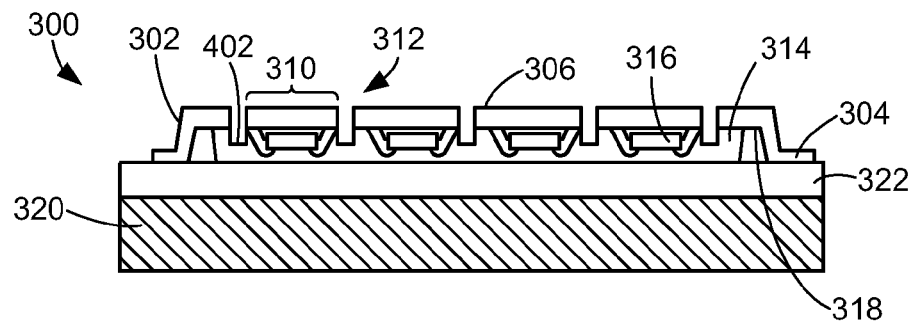
FIG. 4 is a cross-sectional view of the structure of FIG. 3 in an isolation cutting phase.

Referring now to FIG. 4 therein is shown a cross-sectional view of the structure of FIG. 3 in an isolation cutting phase. The integrated circuit package system 300 includes the elevated edge leadframe array 302 having a number of the leadframes 310. The fixture 320 and the mount layer 322 provide structural integrity to and indirect handling of the integrated circuit package system 300 during processing. An isolation process, such as a half-cut sawing, provides an isolation recess 402 electrically isolating each of the leadframes 310 from other of the leadframes 310. The isolation process is applied to the connection surface 306 of the elevated edge leadframe array 302. The isolation process also extends at least to the mounting surface 318 of the elevated edge leadframe array 302.

The integrated circuit die 316 of the integrated circuit packages 312 are electrically isolated by the isolation process applied to the elevated edge leadframe array 302. The isolation process can provide the encapsulant 314 and the bent edge 304 substantially intact by partial saw isolation of the leadframes 310 without cutting the bent edge 304 that can serve as a stiffener. The encapsulant 314 and the bent edge 304 can provide structural integrity and physical connectivity to the integrated circuit packages 312 including the integrated circuit die 316 during processing, such as handling or testing.

It has been discovered that a saw method for the isolation process, such as partial cut saw isolation, can be used, leveraging advantages of simplest and most cost effective process.

Figure 5:
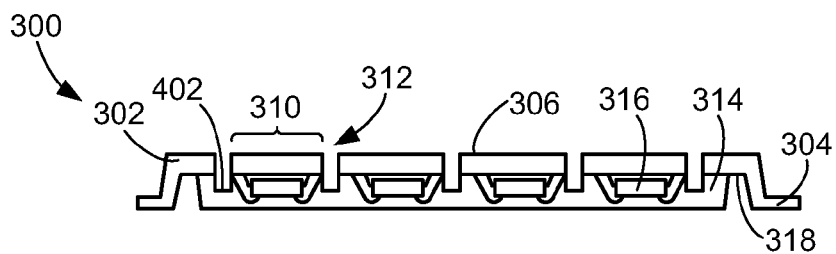
FIG. 5 is a cross-sectional view of the structure of FIG. 4 in a de-mounting phase.

Referring now to FIG. 5, therein is shown a cross-sectional view of the structure of FIG. 4 in a de-mounting phase. The elevated edge leadframe array 302 can be removed from the fixture 320 and the mount layer 322. The encapsulant 314 and the bent edge 304 are substantially intact and provide structural integrity and physically connectivity to the integrated circuit package system 300. The integrated circuit packages 312 of the integrated circuit package system 300 including the leadframes 310 and the integrated circuit die 316 are electrically isolated. Electrical tests can be performed for each of the integrated circuit packages 312 physically connected to one another in the integrated circuit package system 300.

It has been discovered that the isolation recess 402 maintains structural integrity, such as stiffness, and rigidity, of the integrated circuit package system 300 providing efficient testing of the elevated edge leadframe array 302.

Figure 6:
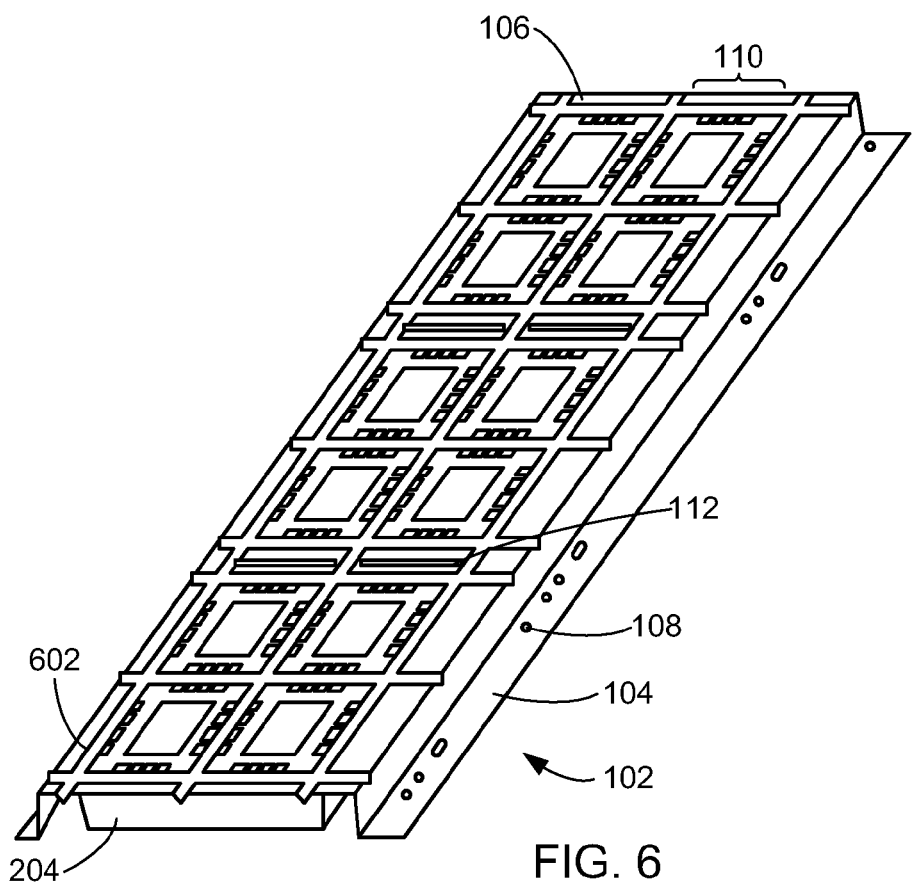
FIG. 6 is an isometric view of the integrated circuit package system 100 in a de-mounting phase.

Referring now to FIG. 6, therein is shown an isometric view of the integrated circuit package system 100 in a de-mounting phase. The integrated circuit package system 100 includes the elevated edge leadframe array 102 including the bent edge 104 elevated from the connection surface 106 of the elevated edge leadframe array 102. The bent edge 104 can also include the edge recesses 108 formed as partially recessed or as through holes. The elevated edge leadframe array 102 also includes the leadframes 110 and the separators 112.

An isolation process provides an isolation recess 602 electrically isolating each of the leadframes 110 from other of the leadframes 110. The isolation process is applied to the connection surface 106 of the elevated edge leadframe array 102. Further, the isolation process can extends to but not through the encapsulant 204. Yet further, the isolation process eliminates cuts through the bent edge 104.

Testing can be performed on the integrated circuit package system 100 having an isolation process applied to the elevated edge leadframe array 102. Each of the leadframes 110 is electrically isolated to provide individual testing while still attached to the elevated edge leadframe array 102. Physical integrity of the encapsulant 204 and the bent edge 104 of the elevated edge leadframe array 102 provide structural integrity to the integrated circuit package system 100.

It has been discovered that the isolation process, such as half-cut sawing, of the elevated edge leadframe array 102 for strip test processes will not saw the bent edge 104 and will leave the bent edge 104 substantially intact so that the elevated edge leadframe array 102 will be substantially rigid and fit for strip test processes and handling processes.

Figure 7:
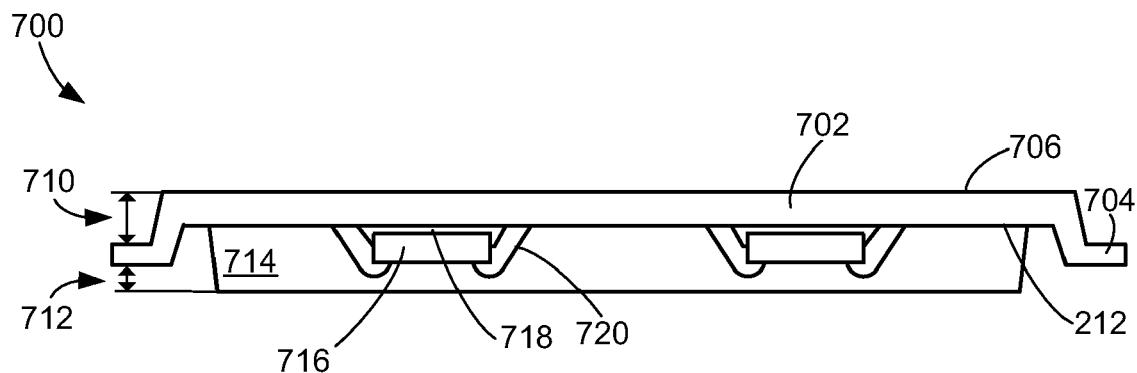
FIG. 7 is a cross-sectional view of an integrated circuit package system in an alternative embodiment of the present invention.

Referring now to FIG. 7, therein is shown a cross-sectional view of an integrated circuit package system 700 in an alternative embodiment of the present invention. In a manner similar to the integrated circuit package system 100 of FIGS. 1 and 2, the integrated circuit package system 700 includes an elevated edge leadframe array 702. The elevated edge leadframe array 702 includes a bent edge 704, such as a folded edge. The bent edge 704 of the elevated edge leadframe array 702 is elevated from a connection surface 706 of the elevated edge leadframe array 702 to eliminate cutting during an isolation process, such as forming the isolation recess 402 of FIG. 4.

The bent edge 704 can be formed to avoid a height of the isolation recess 402 formed by a cutting apparatus (not shown). The bent edge 704 can be formed having a bent offset 710 between the bent edge 704 and the connection surface 706 that clears the height of the isolation recess 402. Forming the bent offset 710 can result in a gap 712 between the bent edge 704 and a mold cap of an encapsulant 714. The encapsulant 714 provides structural integrity and protection for an integrated circuit die 716, an attach layer 718, and die connectors 720 during further processing such as sawing, cutting, singulating, or edge forming.

Figure 8:
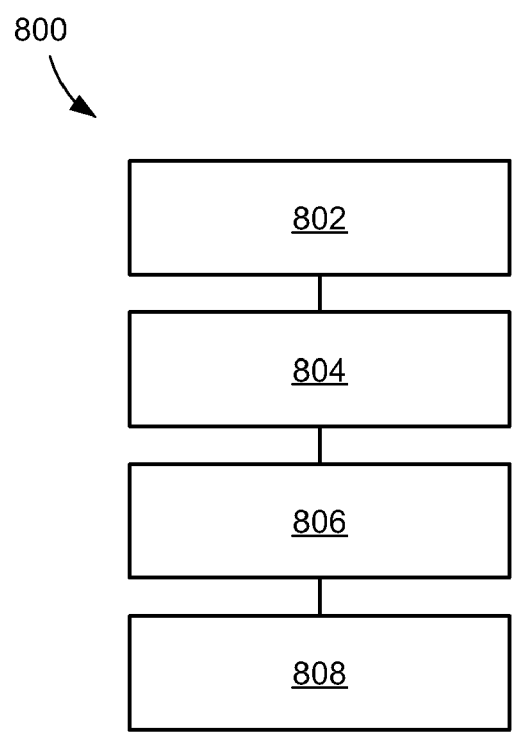
FIG. 8 is a flow chart of an integrated circuit package system for manufacturing the integrated circuit package system in an embodiment of the present invention.

Referring now to FIG. 8, therein is shown a flow chart of an integrated circuit package system 800 for manufacturing the integrated circuit package system 100 in an embodiment of the present invention. The system 800 includes providing an elevated edge leadframe array in a block 802; isolating leadframes of the elevated edge leadframe array in a block 804; validating integrated circuit die attached to the leadframes in a block 806; and forming integrated circuit packages including the integrated circuit die in a block 808.

In greater detail, a system to provide the method and apparatus of the integrated circuit package system 100, in an embodiment of the present invention, is performed as follows:

1. Providing an elevated edge leadframe array having a bent edge.
2. Cutting leadframes of the elevated edge leadframe array for testing.
3. Testing integrated circuit die attached and electrically connected to the leadframes.
4. Singulating integrated circuit packages including the integrated circuit die and the leadframes.

The present invention thus has numerous aspects.

A principle aspect of the present invention is a leadframe with elevated edge. The present invention is unique in that typically isolation sawing, such as half-cut sawing, on leadframe before strip test will result to a fragile strip with edges that are dangling, easily bent, easily broken, sharp, or often is caught in fixtures causing jamming. These often pose difficulty in handling at strip test.

Another aspect is that the present invention eliminates isolation sawing of the leadframe edge using conventional sawing methods. The present invention is unique in that typically, other more complicated and costly isolation cut methods, such as water jet or laser, are being sought instead of half-cut sawing which is simplest and cost effective.

Yet another aspect is that the present invention provides a way to alleviate the problem of isolation processes making the leadframe flimsy and breakable, by allowing partial saw isolation of the units without cutting on the stiffener (rail edges). To do this, the invention proposes a leadframe with recessed edge (or elevated edge, depending on the way you look at it.)

Further, another aspect is that the present invention provides a partial cut saw isolation process (which is one of the most cost effective) and can still have a stiff & rigid leadframe structure, fit for hassle-free strip testing.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit packaging method comprising:
   providing an elevated edge leadframe array;
   isolating leadframes of the elevated edge leadframe array;
   validating integrated circuit die attached to the leadframes; and
   forming integrated circuit packages including the integrated circuit die.

2. The method as claimed in claim 1 wherein providing the elevated edge leadframe array includes pre-forming a bent edge.

3. The method as claimed in claim 1 wherein providing the elevated edge leadframe array includes forming a bent edge around an encapsulant.

4. The method as claimed in claim 1 wherein isolating the leadframes includes applying a sawing process.

5. The method as claimed in claim 1 wherein validating the integrated circuit die includes applying an electrical test.

6. An integrated circuit packaging method comprising:
   providing an elevated edge leadframe array having a bent edge;
   cutting leadframes of the elevated edge leadframe array for testing;
   testing integrated circuit die attached and electrically connected to the leadframes; and
   singulating integrated circuit packages including the integrated circuit die and the leadframes.

7. The method as claimed in claim 6 wherein providing the elevated edge leadframe array includes pre-forming the bent edge without an encapsulant.

8. The method as claimed in claim 6 wherein providing the elevated edge leadframe array includes forming the bent edge around an edge of an encapsulant.

9. The method as claimed in claim 6 wherein cutting the leadframes includes applying a half-cut sawing process.

10. The method as claimed in claim 6 wherein testing the integrated circuit die includes applying an electrical test to the elevated edge leadframe array.

11. An integrated circuit package system comprising:
    an elevated edge leadframe array;
    leadframes of the elevated edge leadframe array;
    integrated circuit die attached to the leadframes; and
    integrated circuit packages including the integrated circuit die.

12. The system as claimed in claim 11 wherein the elevated edge leadframe array includes a bent edge.

13. The system as claimed in claim 11 wherein the elevated edge leadframe array includes a bent edge around an encapsulant.

14. The system as claimed in claim 11 wherein the leadframes include the characteristics of a sawing process.

15. The system as claimed in claim 11 wherein the integrated circuit die is a validated die.

16. The system as claimed in claim 11 wherein:
    the elevated edge leadframe array has a bent edge;
    the leadframes are cut for testing;
    the integrated circuit die are attached and electrically connected to the leadframes; and
    the integrated circuit packages include the integrated circuit die and the leadframes.

17. The system as claimed in claim 16 wherein the elevated edge leadframe array includes the bent edge without an encapsulant.

18. The system as claimed in claim 16 wherein the elevated edge leadframe array includes the bent edge around an edge of an encapsulant.

19. The system as claimed in claim 16 wherein the leadframes include the characteristics of a half-cut sawing process.

20. The system as claimed in claim 16 wherein the integrated circuit die is an electrically tested die in the elevated edge leadframe array.

* * * * *